United States Patent
Jung

(10) Patent No.: US 10,049,754 B1
(45) Date of Patent: Aug. 14, 2018

(54) CONTROLLER AND OPERATING METHOD THEREOF

(71) Applicant: SK hynix Inc., Gyeonggi-do (KR)

(72) Inventor: Won-Jin Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/787,841

(22) Filed: Oct. 19, 2017

(30) Foreign Application Priority Data

Mar. 31, 2017 (KR) ........................ 10-2017-0041688

(51) Int. Cl.
G11C 16/06 (2006.01)
G11C 16/26 (2006.01)
G11C 16/30 (2006.01)
G11C 16/08 (2006.01)

(52) U.S. Cl.
CPC .............. *G11C 16/26* (2013.01); *G11C 16/08* (2013.01); *G11C 16/30* (2013.01)

(58) Field of Classification Search
CPC ...... G11C 11/5628; G11C 16/10; G11C 16/16
See application file for complete search history.

(56) References Cited

U.S. PATENT DOCUMENTS

| 9,159,437 | B2 * | 10/2015 | Jeon | G11C 29/028 |
| 9,691,485 | B1 * | 6/2017 | Kumar | G11C 16/105 |
| 2014/0119115 | A1 * | 5/2014 | Jung | G11C 11/5628 365/185.03 |
| 2016/0004437 | A1 * | 1/2016 | Kim | G11C 29/021 714/764 |
| 2017/0092371 | A1 * | 3/2017 | Harari | G11C 16/3431 |
| 2017/0235633 | A1 * | 8/2017 | Park | G11C 16/3427 714/764 |
| 2017/0337972 | A1 * | 11/2017 | Lee | G11C 16/16 |
| 2018/0091170 | A1 * | 3/2018 | Asami | G11C 16/26 |

FOREIGN PATENT DOCUMENTS

KR 1020150042652 4/2015

* cited by examiner

*Primary Examiner* — Tuan T Nguyen
(74) *Attorney, Agent, or Firm* — IP & T Group LLP

(57) ABSTRACT

An operating method of a controller includes: searching, by using a predetermined read voltage, a valid word line coupled to a memory cell having a predetermined program status, among word lines coupled to a first open memory block of a memory device when a memory system is powered on after a sudden power off (SPO); and reading data from the memory cell coupled to the valid word line, and writing the read data into a second open memory block.

20 Claims, 12 Drawing Sheets

CONTROLLER AND OPERATING METHOD THEREOF

CROSS-REFERENCE TO RELATED APPLICATIONS

The present application claims priority of Korean Patent Application No. 10-2017-0041688, filed on Mar. 31, 2017, which is incorporated herein by reference in its entirety.

BACKGROUND

1. Field

Exemplary embodiments of the present invention relate to a controller, and more particularly to a controller capable of processing data of a memory device and an operating method thereof.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various Interfaces, and solid state drives (SSD).

SUMMARY

Various embodiments are directed to a controller capable of reducing time required for a recovery operation due to a sudden power off (SPO), and an operating method thereof.

In an exemplary embodiment of the present invention, an operating method of a controller may include: searching, by using a predetermined read voltage, a valid word line coupled to a memory cell having a predetermined program status, among word lines coupled to a first open memory block of a memory device when a memory system is powered on after a sudden power off (SPO); and reading data from the memory cell coupled to the valid word line, and writing the read data into a second open memory block.

The predetermined program status may be a highest program status.

The predetermined read voltage may discriminate between the highest program status and the other statues.

The valid word line may be searched by applying the predetermined read voltage to each of the word lines which are coupled to the first memory block sequentially in a reverse order of a program order of the first memory block until a valid word line is found.

The searching of the valid word line may include determining, when a first valid word line is searched, as valid a word line having an earlier program order than the first valid word line.

The first valid word line may be firstly determined as valid while applying the predetermined read voltage to the word lines coupled to the first open memory block in the reverse order.

The read data may be written into the second memory block by writing into the second open memory block valid data among the read data of the valid word line.

The valid data may be error-correctable data.

The predetermined program status may be a lowest program status.

The predetermined read voltage may discriminate between the lowest program status and the other statuses.

In an exemplary embodiment of the present invention, a controller may include: a search unit suitable for searching, by using a predetermined read voltage, a valid word line coupled to a memory cell having a predetermined program status, among word lines coupled to a first open memory block of a memory device when a memory system is powered on after a sudden power off (SPO); a read unit suitable for reading data from the memory cell coupled to the valid word line; and a write unit suitable for writing the read data into a second open memory block.

The predetermined program status may be a highest program status.

The predetermined read voltage may discriminate between the highest program status and the other statuses.

The search unit may search the valid word line by applying the predetermined read voltage to the word lines coupled to the first memory block in a reverse order of a program order of the first memory block.

The search unit may search the valid word line by determining, when a first valid word line is searched, as valid one or more word lines having one or more earlier program orders than the first valid word line.

The first valid word line may be firstly determined as valid while applying the predetermined read voltage to the word lines coupled to the first memory block in the reverse order.

The write unit may write the read data into the second memory block by writing into the second memory block valid data among the read data of the valid word line.

The valid data may be error-correctable data.

The predetermined program status may be a lowest program status.

The predetermined read voltage may discriminate between the lowest program status and the other statuses.

In accordance with various embodiments of the present invention, time required for a recovery operation due to a sudden power off (SPO) may be reduced.

BRIEF DESCRIPTION OF THE DRAWINGS

These and other features and advantages of the present invention will become apparent to those skilled in the art to which the present invention pertains from the following detailed description in reference to the accompanying drawings, in which.

DETAILED DESCRIPTION

Figure 1:
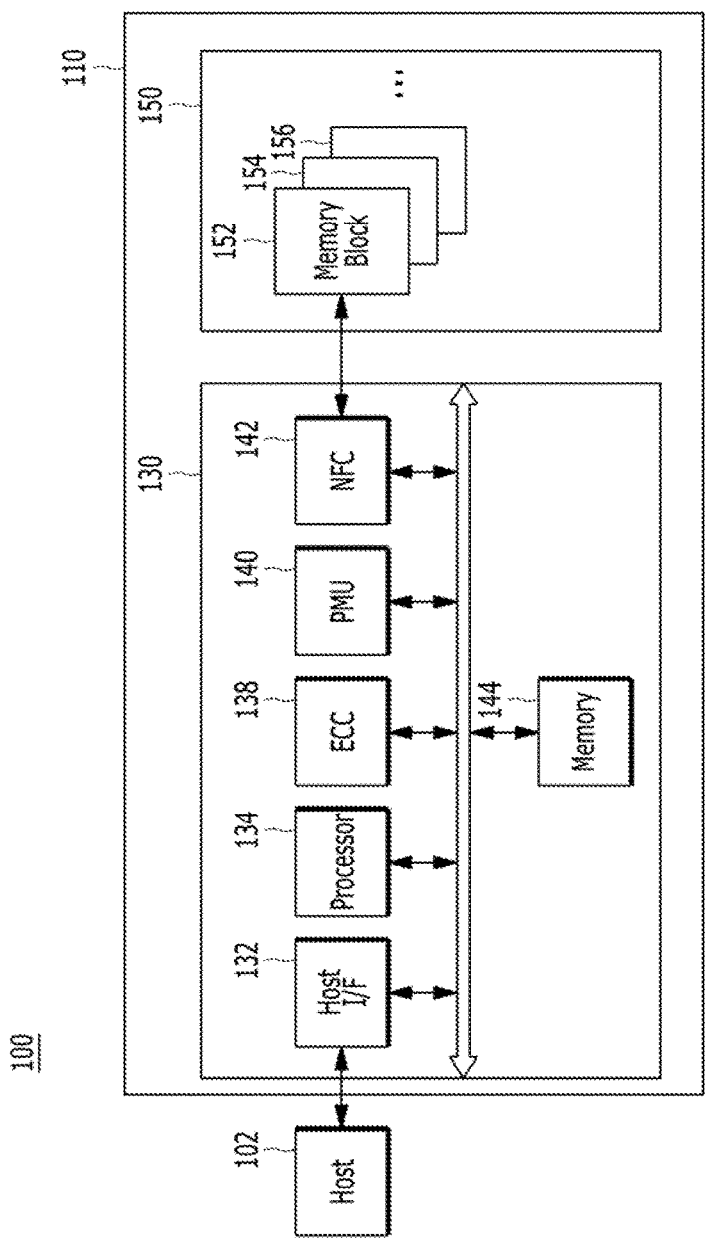
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present Invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some Instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies, each memory die including a plurality of planes, each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
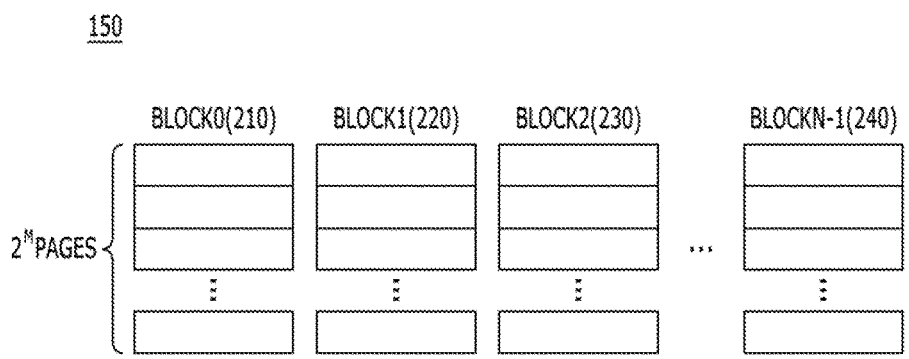
FIG. 2 is a schematic diagram illustrating an exemplary configuration of a memory device employed in a memory system of FIG. 1.

FIG. 2 is a schematic diagram Illustrating an exemplary configuration of the memory device 150.

Referring to FIG. 2, the memory device 150 may include a plurality of memory blocks BLOCK 0 to BLOCK N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
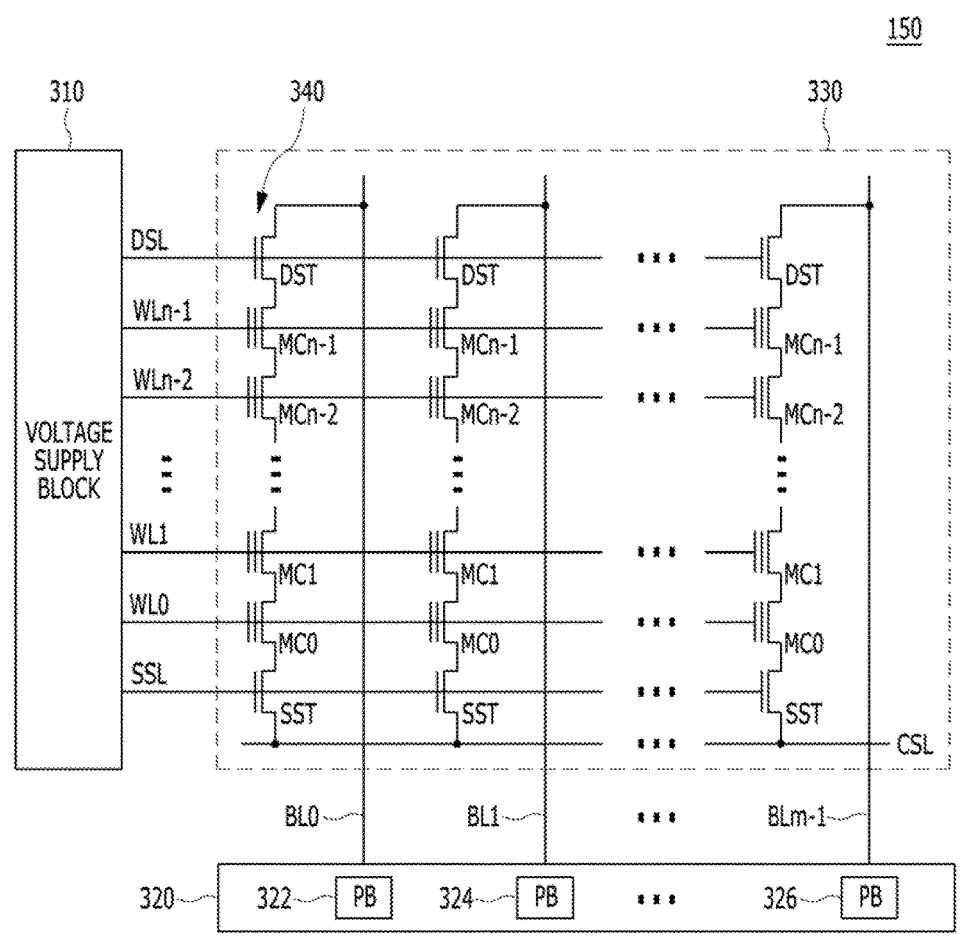
FIG. 3 is a circuit diagram illustrating an exemplary configuration of a memory cell array of a memory block in a memory device of FIG. 1.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 of the memory system 110 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
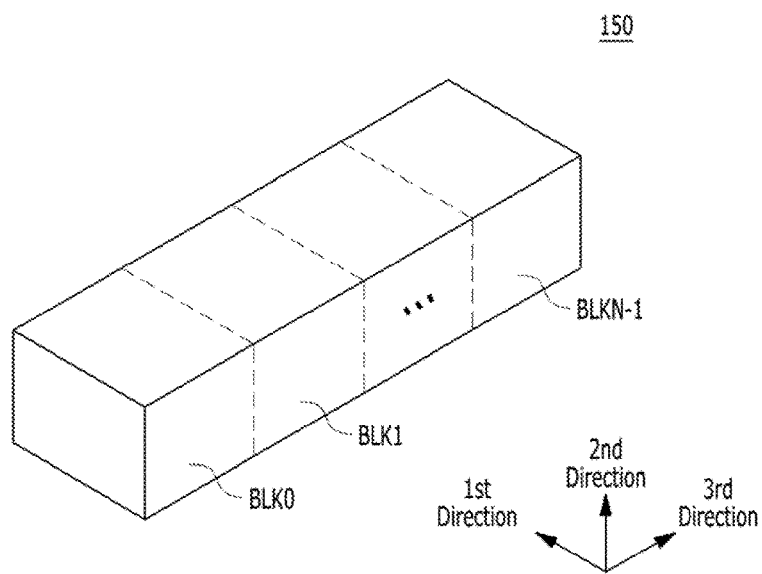
FIG. 4 is a schematic diagram illustrating an exemplary 3D structure of the memory device of FIG. 1.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

Hereinafter, described with reference to FIGS. 5A to 6C will be the controller 130 and an operating method thereof for programming data into an arbitrary word line of the memory device 150.

Figure 5A:
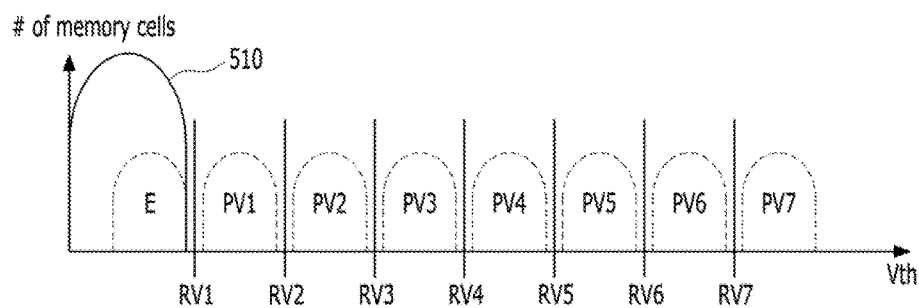
FIG. 5A is a diagram Illustrating a threshold voltage distribution of memory cells coupled to a word line, to which an erase operation is completed.

FIG. 5A is a diagram illustrating a threshold voltage distribution of memory cells coupled to a word line, to which an erase operation is completed.

Figure 5B:
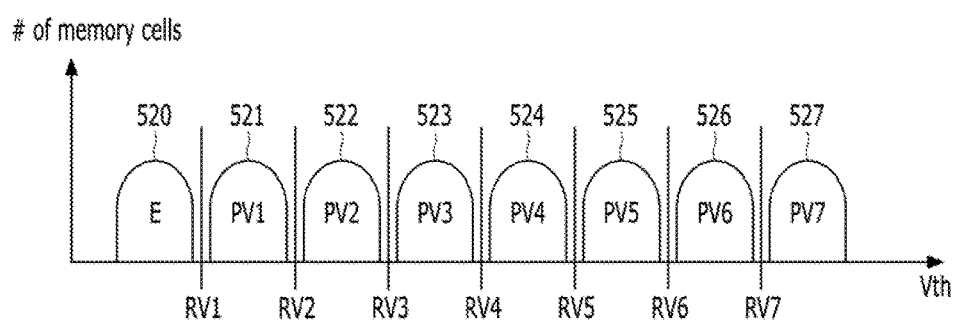
FIG. 5B is a diagram illustrating a threshold voltage distribution of memory cells coupled to a word line, to which a program operation is completed.

FIG. 5B is a diagram illustrating a threshold voltage distribution of memory cells coupled to a word line, to which a program operation is completed.

A memory cell may have a threshold voltage Vth, and may have one of an erase state and program states according to a level of the threshold voltage Vth.

The threshold voltage Vth of a SLC memory cell may be identified by a single read voltage (e.g., a first read voltage RV1), and may have one of an erase state E and a single program state PV1. The threshold voltage Vth of a 2-bit MLC memory cell may be identified by three (3) read voltages (e.g., first to third read voltages RV1 to RV3), and may have one of an erase state E and three (3) program states PV1 to PV3. The threshold voltage Vth of a TLC memory cell may be identified by seven (7) read voltages (e.g., first to seventh read voltages RV1 to RV7), and may have one of an erase state E and seven (7) program states PV1 to PV7. It is assumed that a memory cell is a TLC hereinafter.

Referring to FIG. 5A, of memory cells 510 coupled to a word line, to which an erase operation is completed, may be evaluated to have the erase state E since threshold voltages thereof are under the first read voltage RV1.

The controller 130 may write data into the memory cells 510 coupled to a word line by performing a program operation to the word line, to which an erase operation is completed. Due to the program operation to the memory cells 510, states of the memory cells 510 may change to one of the erase state E and program states PV1 to PV7 from the erase state E.

Referring to FIG. 5B, memory cells coupled to a word line, to which a program operation is completed, may have one of the erase state E and seven (7) program states PV1 to PV7.

As exemplified in FIG. 5B, memory cells 520 having the threshold voltages Vth lower than the first read voltage RV1 may be evaluated to have the erase state E. Memory cells 521 having the threshold voltages Vth between the first and second read voltages RV1 and RV2 may be evaluated to have the first program state PV1. Memory cells 522 having the threshold voltages Vth between the second and third read voltages RV2 and RV3 may be evaluated to have the second program state PV2. In similar manner, memory cells 523 to 527 may be evaluated to have one of the third to seventh program states PV3 to PV3 by the third to seventh read voltages RV3 to RV7.

The controller 130 may perform a program operation to a word line such that numbers of memory cells 520 to 527 having the respective erase and program states E and PV1 to PV7 are substantially the same as one another. In the case of completion of program operation to a word line, a number of memory cells 520 having the erase state E may be substantially the same as a number of memory cells 521 having the first program state PV1, and the number of memory cells 521 having the first program state PV1 may be substantially the same as a number of memory cells 522 having the second program state PV2. Similarly, the number of memory cells 522 having the second program state PV2 may be substantially the same as a number of memory cells having any one of the third to seventh program states PV3 to PV7.

Figure 6A:
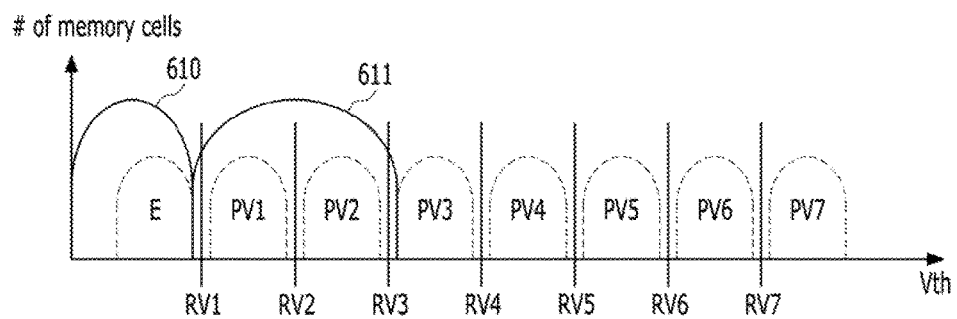
FIGS. 6A to 6C are diagrams illustrating a threshold voltage distribution of memory cells coupled to a word line, to which a program operation is being performed.
Figure 6B:
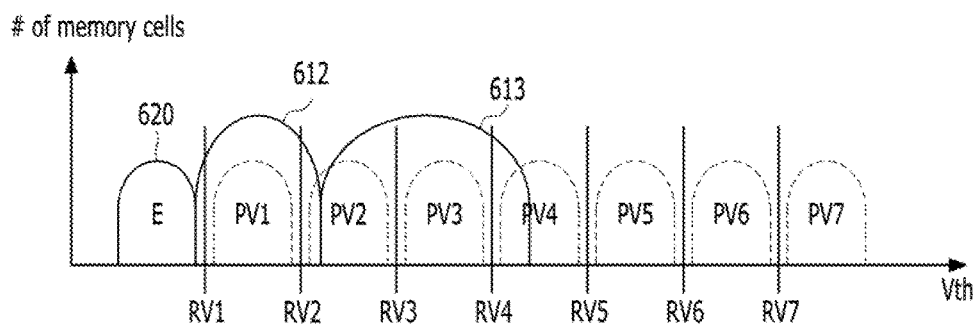
Figure 6C:
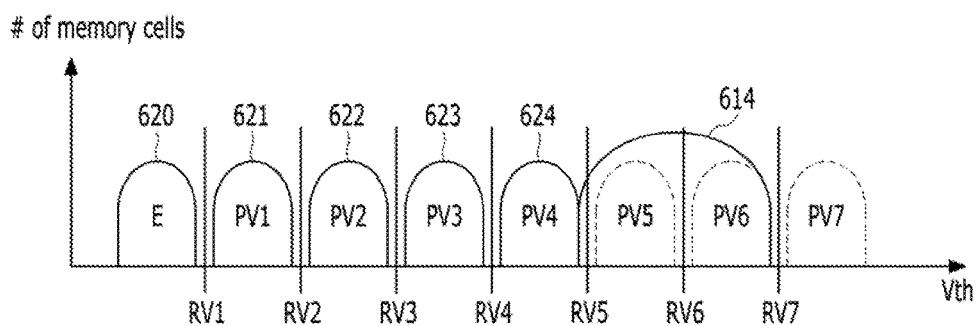

FIGS. 6A to 6C are diagrams Illustrating a threshold voltage distribution of memory cells coupled to a word line, to which a program operation is being performed.

FIGS. 6A to 6C show a threshold voltage distribution of memory cells at beginning, middle and ending phases of the program operation, respectively. FIGS. 6A to 6C show a threshold voltage distribution of memory cells according to a time flow of the program operation.

As Illustrated in FIGS. 6A to 6C, the threshold voltages of memory cells 610 to 614 may rise while the controller 130 is performing a program operation to the word line.

As exemplified in FIG. 6A, while the controller 130 is performing a program operation to the word line, to which an erase operation is completed, the threshold voltages of memory cells 610 and 611 may rise. According to an amount of the threshold rise, the memory cells 610 may be evaluated to have the erase state E and the memory cells 611 may be evaluated to have one of the erase and first to third program states E and PV1 to PV3.

As exemplified in FIG. 6B, while the controller 130 is performing a program operation to the word line, to which an erase operation is completed, the threshold voltages of memory cells 612 and 613 may rise but threshold voltages of the memory cells 620 having target threshold voltages may not rise any more. Accordingly, the memory cells 620 may be evaluated to have the erase state E while the memory cells 612 and 613 may be evaluated to have one of the erase and first to fourth program states E and PV1 to PV4 according to the threshold voltages thereof.

As exemplified in FIG. 6C, while the controller 130 is performing a program operation to the word line, to which an erase operation is completed, the threshold voltages of memory cells 614 may rise but threshold voltages of the memory cells 620 to 624 having target threshold voltages may not rise any more. Accordingly, the memory cells 620 to 624 may be evaluated to have one of the erase and first to fourth program states E and PV1 to PV4 according to the threshold voltages thereof while the memory cells 614 may be evaluated to have one of the fourth to sixth program states PV4 to PV6 according to the threshold voltages thereof. Upon completion of the program operation, the memory cells 614 may have one of the fifth to seventh program states PV5 to PV7 according to the threshold voltages thereof.

When a sudden power off (SPO) occurs in the memory system 110 while the controller 130 is performing a program operation to an open memory block or a free memory block, a threshold voltage distribution of memory blocks coupled to a part of word lines coupled to the open memory block may be the same as those exemplified in FIGS. 6A to 6C. Similarly, a threshold voltage distribution of memory blocks coupled to another part of word lines coupled to the open memory block may be the same as those exemplified in FIG. 5A, and a threshold voltage distribution of memory blocks coupled to remaining part of word lines coupled to the open memory block may be the same as those exemplified in FIG. 5B.

That is, when an SPO occurs in the memory system 110 while the controller 130 is performing a program operation to an open memory block, word lines coupled to the open memory block may include ones to which an erase operation is completed, ones to which a program operation is completed, and ones to which a program operation is being performed.

When the memory system 110 is powered on after the SPO, data stored in memory cells coupled to word lines, to which a program operation is being performed at the time of the SPO among word lines of the open memory block, may be evaluated as invalid. On the other hand, when the memory system 110 is powered on after the SPO, data stored in memory cells coupled to word lines, to which a program operation is completed before the time of the SPO among word lines of the open memory block, may be evaluated as valid.

When the memory system 110 is powered on after the SPO, the controller 130 may perform a recovery operation. In detail, the controller 130 may perform a recovery operation by copying valid ones among data stored in an open memory block, to which an SPO program operation is being performed at the time of the SPO, into another open memory block.

For a recovery operation, the controller 130 may perform a search operation of searching word lines to which memory cells are coupled to store valid data, among word lines coupled to the open memory block, to which an SPO program operation is being performed at the time of the SPO. Hereinafter, the word lines coupled to memory cells which store valid data, are referred to as valid word lines, and the word lines coupled to memory cells which store Invalid data, are referred to as invalid word lines.

In order to determine whether or not a target word line is a valid word line, the controller 130 may read data from 3 arbitrary pages coupled to the target word line and determine whether or not the read data is valid. Accordingly, when memory cells coupled to the target word line are TLCs, in order to determine whether or not the target word line is a valid word line, read voltages should be applied to the word line at least seven (7) times to read data, the ECC decoding operation should be performed to the read data and changed read voltages should be additionally applied to the target word line when the ECC decoding operation fails.

Therefore, the recovery operation may take a considerable amount of time due to a substantial amount of time needed for searching for the valid word line.

Hereinafter, described with reference to FIGS. 7 and 8 will be a recovery operation of the memory system 110 in accordance with an embodiment of the present invention.

Figure 7:
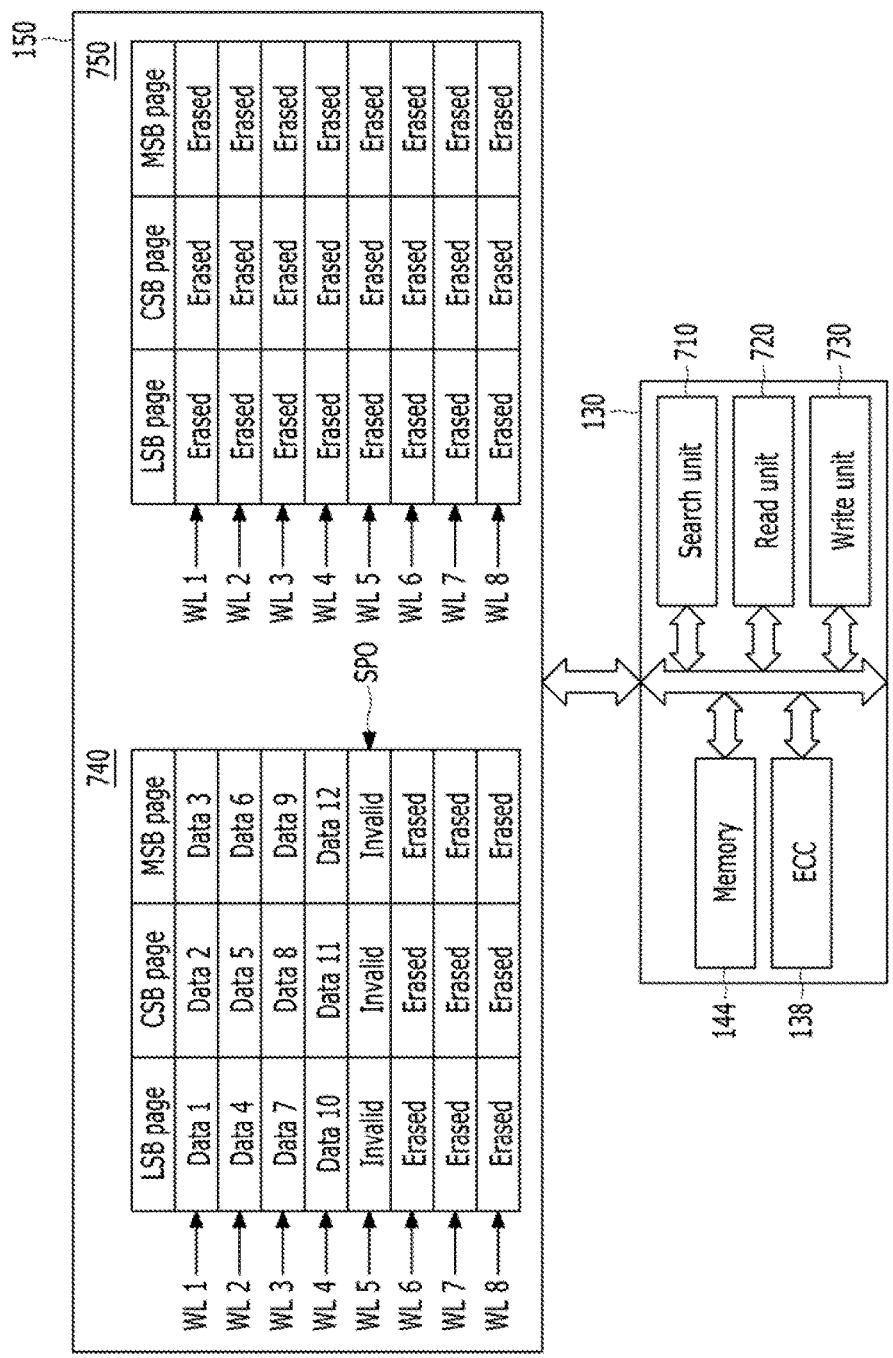
FIG. 7 is a diagram exemplarily illustrating a memory system, in which an SPO occurs during a program operation to a first memory block.

FIG. 7 is a diagram exemplarily illustrating the memory system 110, in which an SPO occurs during a program operation to a first memory block.

Figure 8:
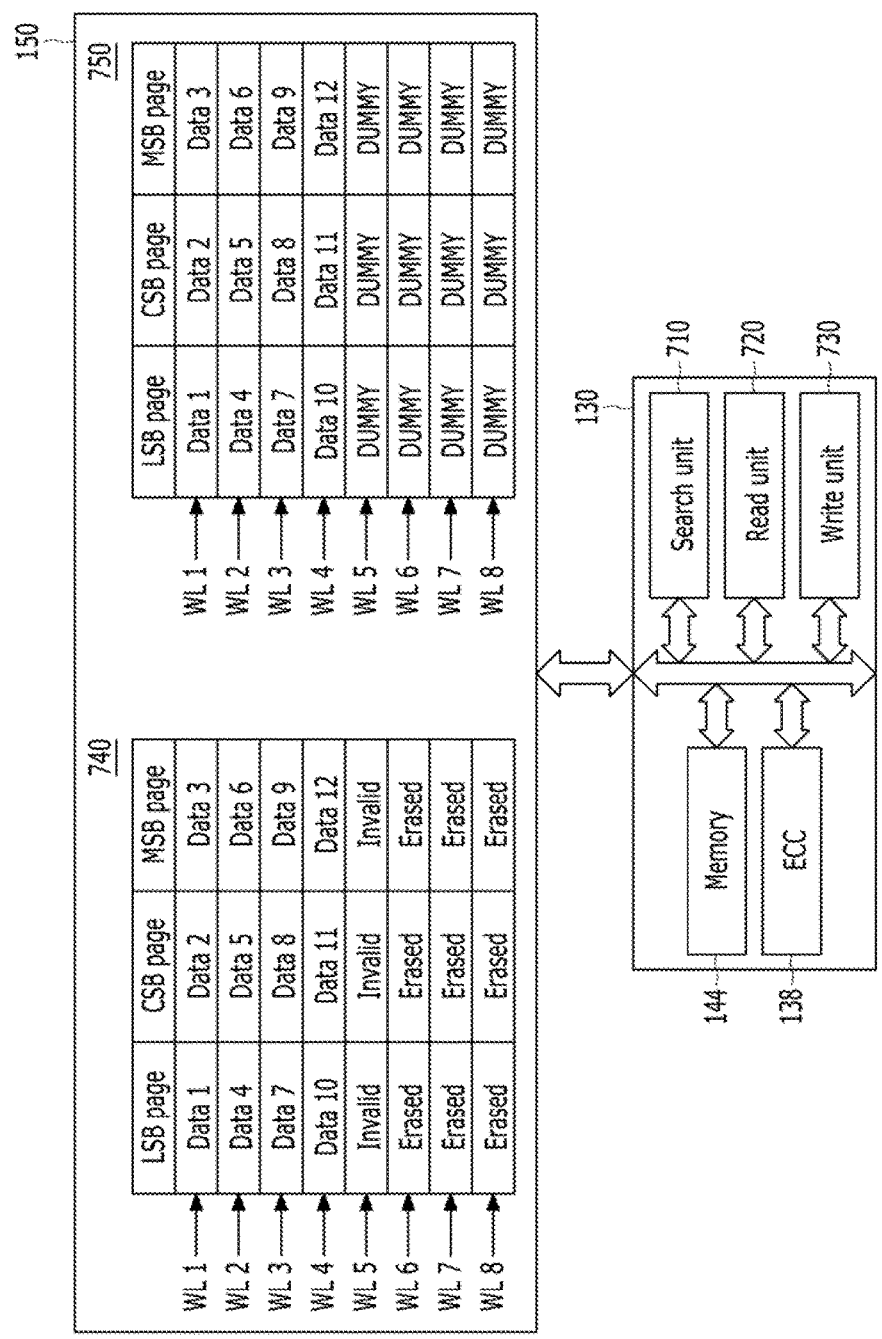
FIG. 8 is a diagram exemplarily illustrating a memory system, to which a recovery operation is performed after the SPO.

FIG. 8 is a diagram exemplarily illustrating the memory system 110, to which a recovery operation is performed after the SPO.

Referring to FIG. 7, in accordance with an embodiment of the present invention, the memory system 110 may include the controller 130 and the memory device 150. The controller 130 may include the ECC unit 138, the memory 144, a search unit 710, a read unit 720 and a write unit 730.

The memory device 150 may include a plurality of memory blocks 740 and 750. Each of the memory blocks 740 and 750 may be coupled to a plurality of word lines WL1 to WL8, and each of the word lines WL1 to WL8 may be coupled to a plurality of pages including one or more of LSB, CSB and MSB pages. As exemplified in FIG. 7, when memory cells of the memory blocks 740 and 750 are TLCs, each of the word lines WL1 to WL8 may be coupled to three (3) pages (i.e., LSB, CSB and MSB pages).

FIG. 7 exemplifies the occurrence of an SPO while the write unit 730 of the controller 130 is performing a write operation to the first memory block 740. Particularly, FIG. 7 shows a situation that an SPO occurs while the write unit 730 is performing a write operation to a fifth word line WL5 after completion of a write operation to first to fourth word lines WL1 to WL4.

The search unit 710 may search valid ones among the word lines coupled to the memory blocks 740 and 750 in response to a search command from the controller 130. Particularly, when the memory system 110 is powered on after an SPO, the search unit 710 may search valid word lines coupled to the first memory block 740, to which a program operation was being performed at a time of the SPO.

When searching valid word lines coupled to the first memory block 740, the search unit 710 may detect the valid word lines by searching in a reversed direction of a program order of the word lines WL1 to WL8. For example, when the program order is an ascending order from the first word line WL1 to the eighth word line WL8, the reversed order is a descending order from the eighth word line WL8 to the first word line WL1. For example, when the program operation is performed to the first memory block 740 in the ascending order form the first word line WL1 to the eighth word line WL8, the search unit 710 may detect the valid word lines by searching the first memory block 740 in the descending order from the eighth word line WL8 to the first word line WL1. As described above, the search unit 710 may determine a word line as valid when the search unit 710 determines memory cells coupled to the word line to store valid data.

When a first valid word line is detected during the search operation, the search unit 710 may also determine as valid word lines of earlier program order than the firstly detected valid word line. For example, when the fourth word line WL4 is detected as valid, the search unit 710 may also determine as valid the first to third word lines WL1 to WL3 which are of earlier program order than the fourth word line WL4. Accordingly, the first to fourth word lines WL1 to WL4 may be determined as valid when the fourth word line WL4 is firstly detected as valid.

The search unit 710 may determine the status of a memory cell coupled to the word lines WL1 to WL8 by applying a predetermined read voltage to the word lines WL1 to WL8. The predetermined read voltage may be one of the first to seventh read voltages RV1 to RV7. For example, the predetermined read voltage may be the seventh read voltage RV7 to discriminate between the highest program state (i.e., the seventh program state PV7) and the other states (i.e., the erase and first to sixth program states E and PV1 to PV6). For example, the predetermined read voltage may be the first read voltage RV1 to discriminate between the lowest program state (i.e., the erase state E) and the other states (i.e., the first to seventh program states PV1 to PV7).

The search unit 710 may determine the status of a memory cell coupled to the word lines WL1 to WL8 by applying the predetermined read voltage to the word lines WL1 to WL8 and reading data from the memory cells coupled to the word lines WL1 to WL8. Hereinafter, it is assumed that data read from a memory cell whose threshold voltage is below the predetermined read voltage is zero (0) while data read from a memory cell whose threshold voltage is over the predetermined read voltage is one (1). The status of a memory cell may be a lower one when data read from the memory cell is zero (0) while the status of a memory cell may be a higher one when data read from the memory cell is one (1). For example, when the predetermined read voltage is the fourth read voltage RV4, the higher status may be one of the fourth to seventh program statuses PV4 to PV7 and the lower status may be one of the erase and first to third program statuses E and PV1 to PV3. That is, a memory cell may have the higher status when the threshold voltage thereof is over the predetermined read voltage while a memory cell may have the lower status when the threshold voltage thereof is under the predetermined read voltage.

The search unit 710 may determine whether or not a word line is the valid word line based on the status of a memory cell coupled to the word line. Particularly, the search unit 710 may determine a word line as valid when the word line is coupled to a memory cell determined to have the higher status.

For example, when the predetermined read voltage is the seventh read voltage RV7, memory cells coupled to the fifth to eighth word lines WL5 to WL8 may be determined to have the lower state since the memory cells coupled to the fifth to eighth word lines WL5 to WL8 have states equal to or lower than the sixth program state PV6. Accordingly, the search unit 710 may determine the fifth to eighth word lines WL5 to WL8 as invalid.

On the other hand, when the predetermined read voltage is the seventh read voltage RV7, a part of memory cells coupled to the fourth word line WL4 may be determined to have the higher state since the partial memory cells coupled to the fourth word line WL4 have the seventh program state PV7. Accordingly, the search unit 710 may determine the fourth word line WL4 as valid. Further, the search unit 710 may determine the first to third word lines WL1 to WL3 having the earlier program order than the fourth word line WL4 also as valid since the fourth word line WL4 is determined as valid.

For example, when the predetermined read voltage is the first read voltage RV1, memory cells coupled to the sixth to eighth word lines WL6 to WL8 may be determined to have the lower state since the memory cells coupled to the sixth to eighth word lines WL6 to WL8 have the erase state E. Accordingly, the search unit 710 may determine the sixth to eighth word lines WL6 to WL8 as invalid.

On the other hand, when the predetermined read voltage is the first read voltage RV1, a part of memory cells coupled to the fifth word line WL5 may be determined to have the higher state since the partial memory cells coupled to the fifth word line WL5 have the first program state PV1. Accordingly, the search unit 710 may determine the fifth word line WL5 as valid. Further, the search unit 710 may determine the first to fourth word lines WL1 to WL4 having the earlier program order than the fifth word line WL5 also as valid since the fifth word line WL5 is determined as valid.

The read unit 720 may read data from the memory blocks 740 and 750 and store the read data into the memory 144 in response to a read command from the controller 130. Particularly, when the memory system 110 is powered on after an SPO, the read unit 720 may store into the memory 144 data read from the memory cells coupled to the word lines that the search unit 710 determines as valid.

For example, when the search unit 710 determines the first to fourth word lines WL1 to WL4 as valid according to the seventh read voltage RV7, the read unit 720 may read data from the respective LSB, CSB and MSB pages of the first memory block 740 coupled to the first to fourth word lines WL1 to WL4 and store the read data into the memory 144.

For example, when the search unit 710 determines the first to fifth word lines WL1 to WL5 as valid according to the first read voltage RV1, the read unit 720 may read data from the respective LSB, CSB and MSB pages of the first memory block 740 coupled to the first to fifth word lines WL1 to WL5 and store the read data into the memory 144.

The read unit 720 may read data from the respective LSB, CSB and MSB pages coupled to the valid word lines by applying the read voltages RV1 to RV7 to the valid word lines.

The ECC unit 138 may detect and correct an error of data stored in the memory 144. Also, the ECC unit 138 may determine data as valid when the data have a number of error bits equal to or smaller than a predetermined number of correctable error bits, but may determine data as invalid when the data have a number of error bits greater than the predetermined number of correctable error bits.

For example, when the read unit 720 stores into the memory 144 a twelfth data DATA 12 read from the MSB page of the fourth word line WL4 and the ECC unit 138 detects from the twelfth data DATA 12 a number of errors greater than the predetermined number of correctable error bits, the ECC unit 138 may determine the twelfth data DATA 12 as invalid.

For example, when the read unit 720 stores into the memory 144 data read from memory cells of the fifth word line WL5 and the ECC unit 138 detects from the read data a number of errors greater than the predetermined number of correctable error bits, the ECC unit 138 may determine the read data as invalid.

The write unit 730 may write data of the memory 144 into the memory blocks 740 and 750 in response to a program command from the controller 130. Particularly, the write unit 730 may write data, which is determined as valid by the ECC unit 138 among data stored in the memory 144, into the memory blocks 740 and 750.

As exemplified in FIG. 8, the write unit 730 write first to eleventh data DATA1 to DATA11 other than the twelfth data DATA12, which is determined as invalid by the ECC unit 138, into the second memory block 750.

When a storage capacity of the memory 144 is smaller than that of an open memory block, the write unit 730 may write dummy data into the open memory block while writing the valid data from the memory 144 into the open memory block. As exemplified in FIG. 8, the write unit 730 may write the first to eleventh data DATA1 to DATA11 into memory cells of the second memory block 750 coupled to the first to third word lines WL1 to WL3 and into LSB and CSB pages of the second memory block 750 coupled to the fourth word line WL4, and may write dummy data into remaining storage space of the second memory block 750 (i.e., a MSB page of the fourth word line WL4, and memory cells coupled to the fifth to eighth word lines WL5 to WL8).

While writing data of the memory 144 into the memory blocks 740 and 750, the write unit 730 may write data into another open memory block. Another open memory block is defined as an open memory block other than the memory block, to which a program operation is being performed at the time of the SPO. As exemplified in FIG. 8, the first memory block 740 is the open memory block, to which a program operation is being performed at the time of the SPO, and the second memory block 750 is another open memory block.

Therefore, the write unit 730 may write the data, which is read from the first memory block 740 and stored in the memory 144, into the second memory block 750.

Figure 9:
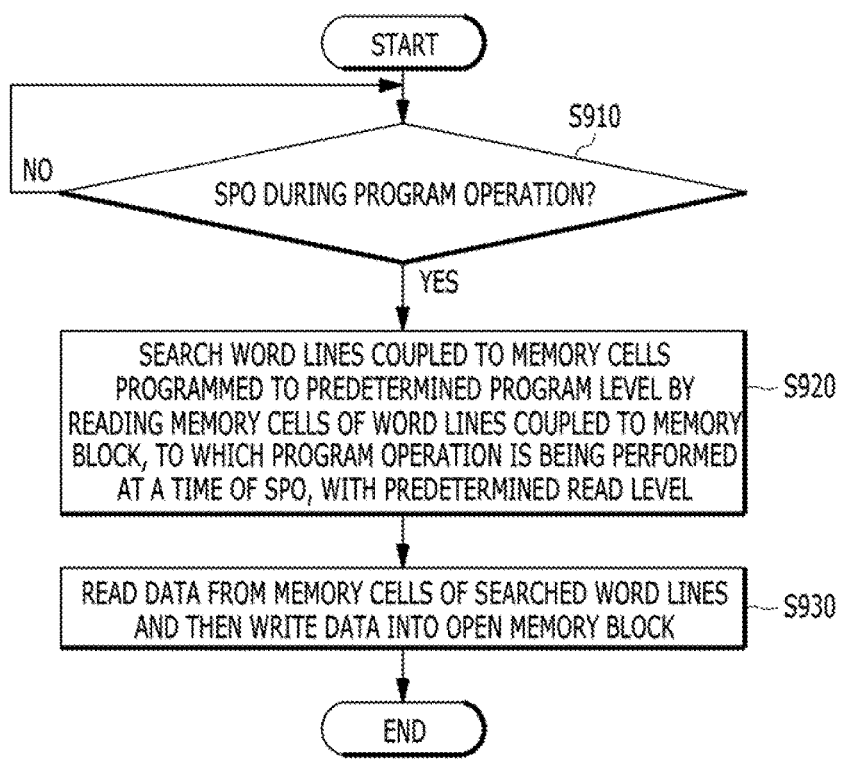
FIG. 9 is a flow chart illustrating a memory system operation of searching a valid word line and writing data of the searched valid word line into an open memory block, in accordance with an embodiment of the present invention.

FIG. 9 is a flow chart illustrating an operation of the memory system 110. The operation includes performing an operation of searching a valid word line in a memory block in which a program operation was being performed at a time of an SPO, and upon finding a valid word line then writing data of the valid word line into another open memory block in accordance with an embodiment of the present invention.

Referring to FIG. 9, at step S910, the controller 130 may determine whether or not an SPO occurs while a program operation is performed to an open memory block.

The controller 130 may proceed to step S920 when the controller 130 determines T that an SPO did occur while a program operation was performed to an open memory block ("YES" at step S910), and may go back to step S910 when the controller 130 determines that an SPO did not occur while a program operation was performed to an open memory block ("NO" at step S910).

At step S920, the controller 130 may search word lines with memory cells coupled thereto which are programmed to predetermined program levels, among word lines coupled to the open memory block, to which a program operation was being performed at the time of the SPO.

At step S930, the controller 130 may write data of memory cells coupled to the searched word line into another open memory block.

As described above, in accordance with an embodiment of the present invention, the memory system 110 may search a word line, to which a program operation is normally completed at a time of an SPO, by using a single read voltage. Therefore, the time required to search for the valid word line during the recovery operation after the SPO may be substantially reduced.

Hereinafter, described with reference to FIGS. 10 to 18 will be a data processing system and an electronic apparatus in accordance with an embodiment of the present invention. The data processing system and electronic apparatus may include the memory system 110 described above with reference to FIGS. 1 to 9.

FIGS. 10 to 18 are schematic diagrams illustrating various embodiments of a data processing system including the memory system 110.

Figure 10:
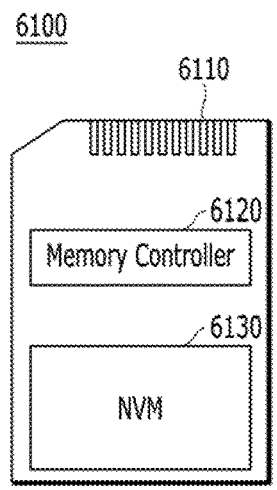
FIGS. 10 to 18 are schematic diagrams illustrating various embodiments of a data processing system including a memory system according to FIGS. 1 to 9.

FIG. 10 is a diagram schematically Illustrating an embodiment of the data processing system including the memory system 110. FIG. 10 schematically illustrates a memory card system 6100 to which the memory system 110 is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 9, and the memory device 6130 may correspond to the memory device 150 of the memory system 110 described with reference to FIGS. 1 to 9.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
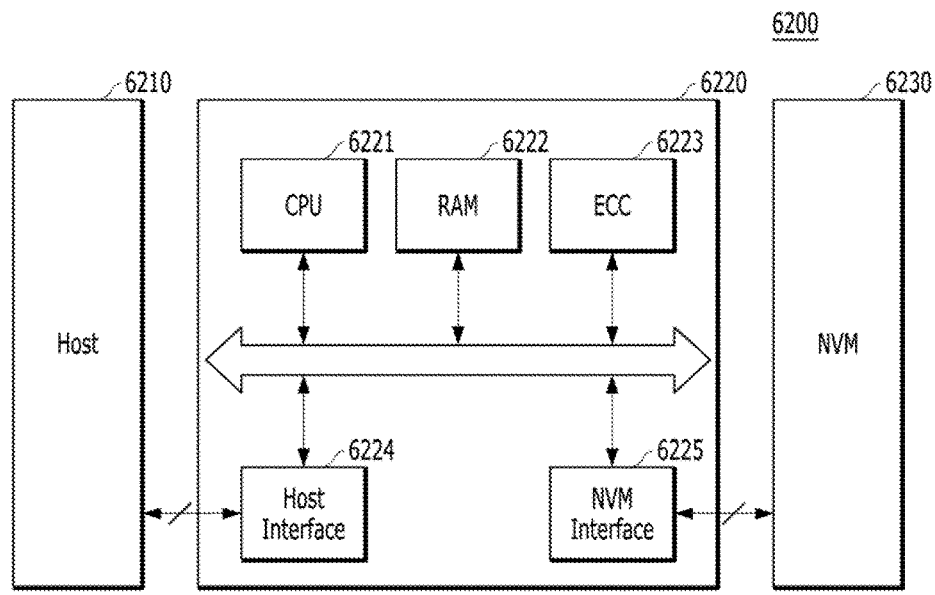

FIG. 11 is a diagram schematically illustrating another embodiment of the data processing system 6200 including the memory system 110.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 to 9, and the memory controller 6220 may correspond to the controller 130 in the memory system 110 illustrated in FIGS. 1 to 9.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host Interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
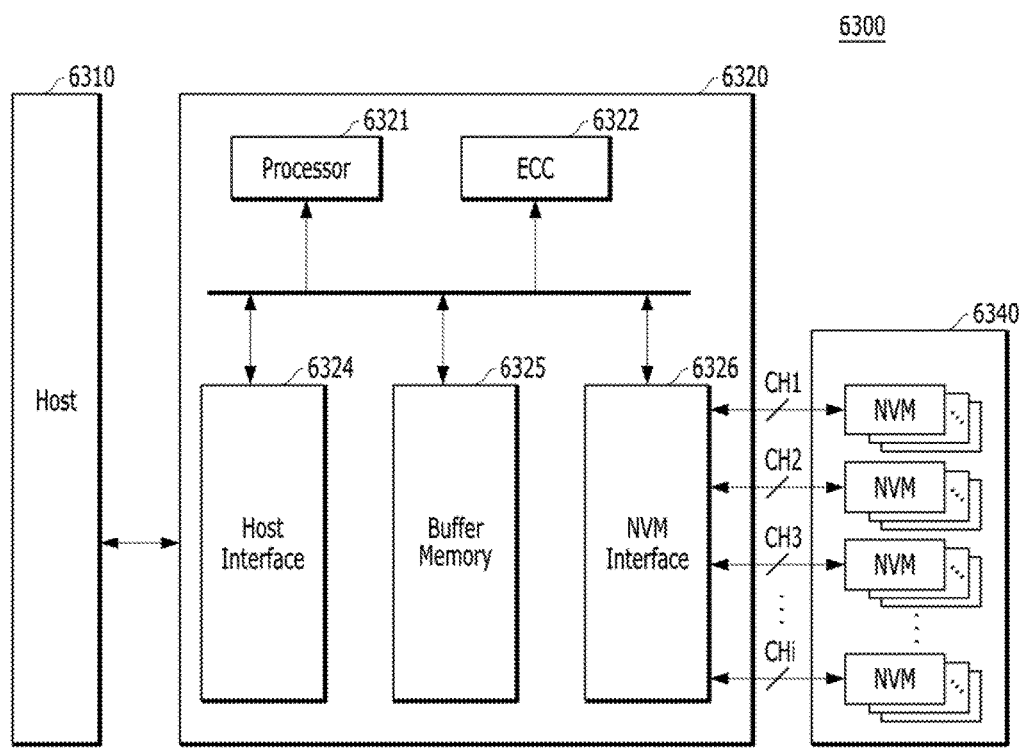

FIG. 12 is a diagram schematically illustrating another embodiment of the data processing system including the memory system 110. FIG. 12 schematically illustrates an SSD 6300 to which the memory system 110 is applied.

Referring to FIG. 12, the SSD 6300 may include a controller 6320 and a memory device 6340 including a plurality of nonvolatile memories. The controller 6320 may correspond to the controller 130 in the memory system 110 of FIGS. 1 to 9, and the memory device 6340 may correspond to the memory device 150 in the memory system of FIGS. 1 to 9.

More specifically, the controller 6320 may be connected to the memory device 6340 through a plurality of channels CH1 to CHi. The controller 6320 may include one or more processors 6321, a buffer memory 6325, an ECC circuit 6322, a host Interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 12 illustrates that the buffer memory 6325 is provided in the controller 6320. However, the buffer memory 6325 may be provided outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 to 9 is applied may be provided to embody a data processing system, for example, Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
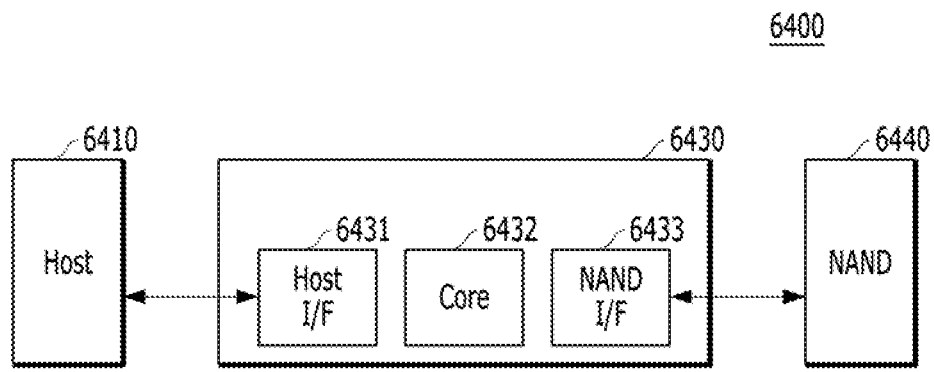

FIG. 13 is a diagram schematically illustrating another embodiment of the data processing system including the memory system 110. FIG. 13 schematically illustrates an embedded Multi-Media Card (eMMC) 6400 to which the memory system 110 is applied.

Referring to FIG. 13, the eMMC 6400 may include a controller 6430 and a memory device 6440 embodied by one or more NAND flash memories. The controller 6430 may correspond to the controller 130 in the memory system 110 of FIGS. 1 to 9, and the memory device 6440 may correspond to the memory device 150 in the memory system 110 of FIGS. 1 to 9.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host Interface 6431 may serve as a parallel interface, for example, MMC interface as described with reference to FIG. 1. Furthermore, the host interface 6431 may serve as a serial Interface, for example, Ultra High Speed (UHS-I/UHS-II) interface.

FIGS. 14 to 17 are diagrams schematically illustrating other embodiments of the data processing system including the memory system 110. FIGS. 14 to 17 schematically illustrate Universal Flash Storage (UFS) systems to which the memory system 110 is applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, Mobile Industry Processor Interface (MIPI) M-PHY and MIPI Unified Protocol (UniPro) in MIPI. Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
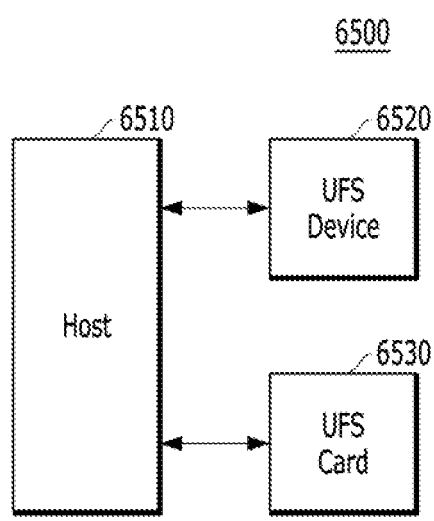

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
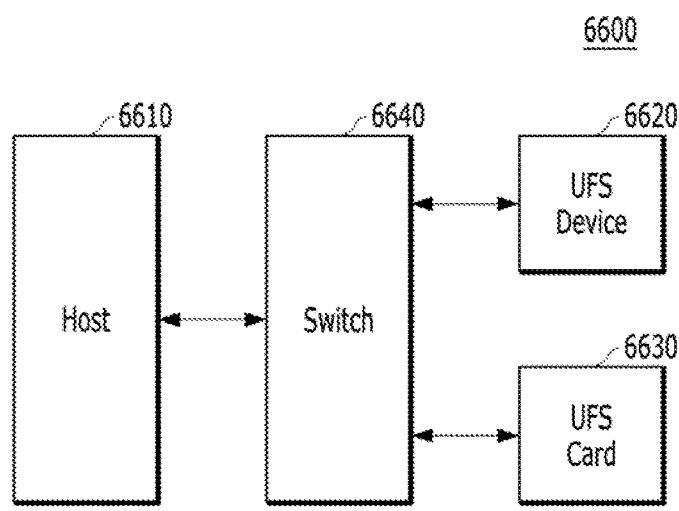

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
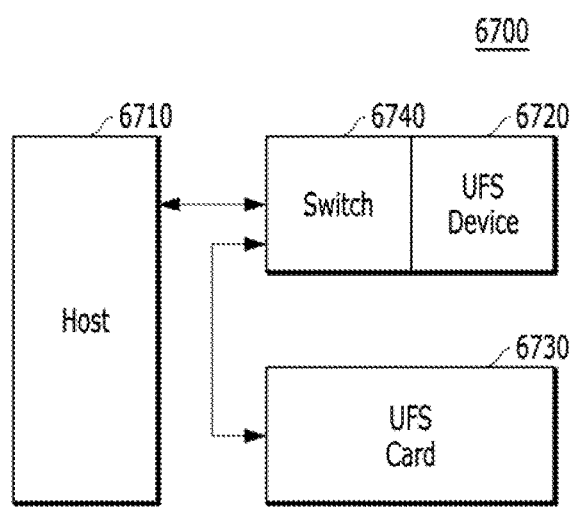

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
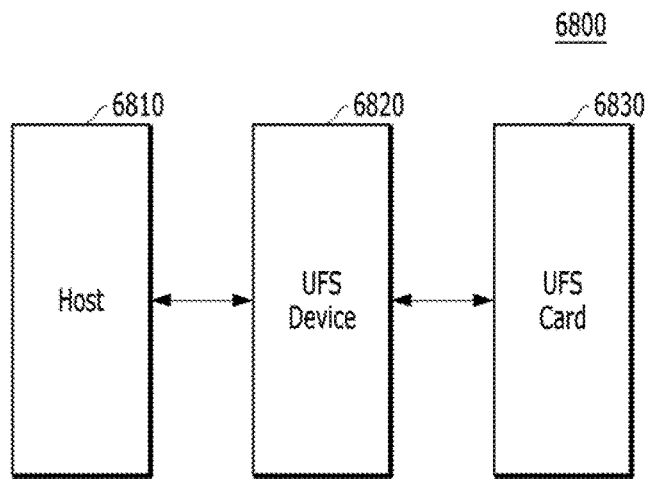

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
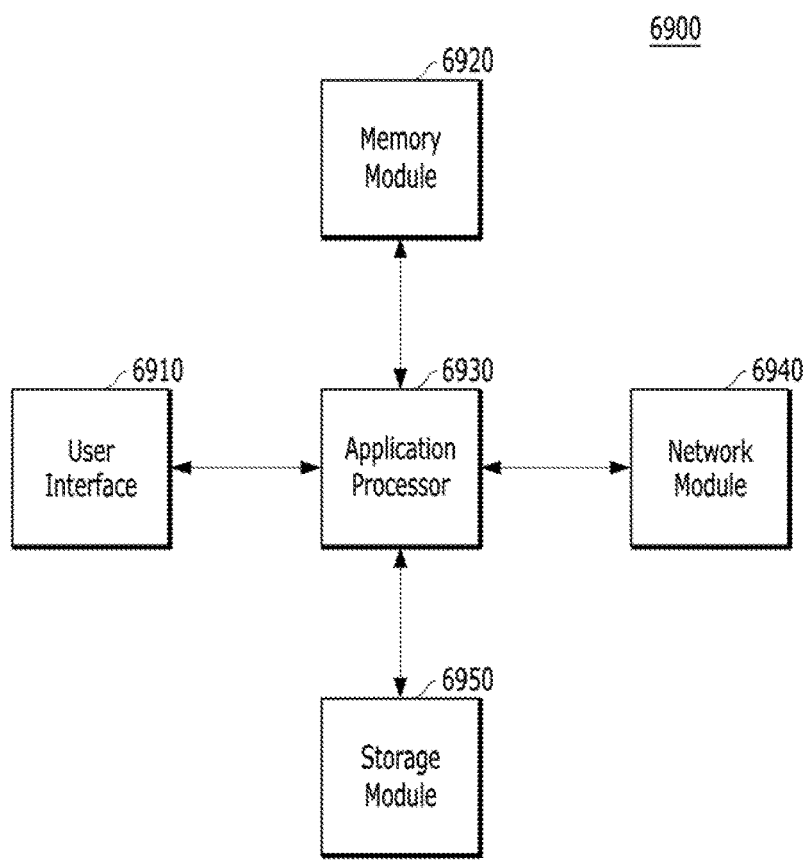

FIG. 18 is a diagram illustrating another embodiment of the data processing system including the memory system 110. FIG. 18 schematically illustrates a user system 6900 to which the memory system according to the embodiment is applied.

Referring to FIG. 18, the user system 6900 may include an application processor 6930, a memory module 6920, a network module 6940, a storage module 6950, and a user interface 6910.

The application processor 6930 may drive components included in the user system 6900 and an operating system (OS). For example, the application processor 6930 may include controllers for controlling the components included in the user system 6900, interfaces, graphics engines, and so on. The application processor 6930 may be provided by a system-on-chip (SoC).

The memory module 6920 may operate as a main memory, a working memory, a buffer memory or a cache memory of the user system 6900. The memory module 6920 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6930 and the memory module 6920 may be mounted by being packaged on the basis of a package-on-package (POP).

The network module 6940 may communicate with external devices. For example, the network module 6940 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6940 may be included in the application processor 6930.

The storage module 6950 may store data such as data received from the application processor 6530, and transmit data stored therein, to the application processor 6530. The storage module 6950 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6950 may be provided as a removable storage medium such as a memory card of the user system 6900 and an external drive. For example, the storage module 6950 may correspond to the memory system 110 described above with reference to FIG. 1, and may be implemented with the SSD, eMMC and UFS described above with reference to FIGS. 12 to 17.

The user interface 6910 may include interfaces for inputting data or commands to the application processor 6930 or for outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6900 according to an embodiment, the application processor 6930 may control the operations of the mobile electronic appliance, and the network module 6940 as a communication module may control wired/wireless communication with an external device, as described above. The user interface 6910 as the display/touch module of the mobile electronic appliance displays data processed by the application processor 6930 or supports input of data from a touch panel.

While the present invention has been described with respect to specific embodiments, it will be apparent to those skilled in the art that various changes and modifications may be made without departing from the spirit and scope of the invention as defined in the following claims.

What is claimed is:

1. An operation method of a controller comprising:
searching, by using a predetermined read voltage, a valid word line coupled to a memory cell having a predetermined program status, among word lines coupled to a first open memory block of a memory device when a memory system is powered on after a sudden power off (SPO); and
reading data from the memory cell coupled to the valid word line, and writing the read data into a second open memory block.

2. The operation method of claim 1, wherein the predetermined program status is a highest program status.

3. The operation method of claim 2, wherein the predetermined read voltage is a voltage selected to discriminate between the highest program status and the other statuses.

4. The operation method of claim 1, wherein the valid word line is searched by applying the predetermined read voltage to each of the word lines which are coupled to the first memory block sequentially in a reverse order of a program order of the first memory block until a valid word line is found.

5. The operation method of claim 4, wherein when a first valid word line is found, determining as valid a word line having an earlier program order than the first valid word line.

6. The operation method of claim 5, wherein the first valid word line is firstly determined as valid while applying the predetermined read voltage to the word lines coupled to the first open memory block in the reverse order.

7. The operation method of claim 3, wherein the read data is written into the second memory block by writing into the second open memory block valid data among the read data of the valid word line.

8. The operation method of claim 1, wherein the valid data is error-correctable data.

9. The operation method of claim 1, wherein the predetermined program status is a lowest program status.

10. The operation method of claim 9, wherein the predetermined read voltage discriminates between the lowest program status and the other statuses.

11. A controller comprising:
a search unit suitable for searching, by using a predetermined read voltage, a valid word line coupled to a memory cell having a predetermined program status, among word lines coupled to a first open memory block of a memory device when a memory system is powered on after a sudden power off (SPO);
a read unit suitable for reading data from the memory cell coupled to the valid word line; and
a write unit suitable for writing the read data into a second open memory block.

12. The controller of claim 11, wherein the predetermined program status is a highest program status.

13. The controller of claim 12, wherein the predetermined read voltage discriminates between the highest program status and the other statuses.

14. The controller of claim 13, wherein the search unit searches the valid word line by applying the predetermined read voltage to the word lines coupled to the first memory block in a reverse order of a program order of the first memory block.

15. The controller of claim 14, wherein the search unit searches the valid word line by determining, when a first valid word line is searched, as valid one or more word lines having one or more earlier program orders than the first valid word line.

16. The controller of claim 15, wherein the first valid word line is firstly determined as valid while applying the predetermined read voltage to the word lines coupled to the first memory block in the reverse order.

17. The controller of claim 13, wherein the write unit writes the read data into the second memory block by writing into the second memory block valid data among the read data of the valid word line.

18. The controller of claim 17, wherein the valid data is error-correctable data.

19. The controller of claim 11, wherein the predetermined program status is a lowest program status.

20. The controller of claim 19, wherein the predetermined read voltage discriminates between the lowest program status and the other statuses.

* * * * *